United States Patent
Campbell et al.

(10) Patent No.: US 7,983,040 B2
(45) Date of Patent: Jul. 19, 2011

(54) APPARATUS AND METHOD FOR FACILITATING PUMPED IMMERSION-COOLING OF AN ELECTRONIC SUBSYSTEM

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 12/256,628

(22) Filed: Oct. 23, 2008

(65) Prior Publication Data
US 2010/0103618 A1    Apr. 29, 2010

(51) Int. Cl.
*H05K 7/20* (2006.01)
*F28F 7/00* (2006.01)
*H01L 23/34* (2006.01)

(52) U.S. Cl. ...... 361/699; 361/727; 165/80.4; 165/80.5; 165/104.33; 174/15.1; 174/17 LF; 62/259.2; 257/714

(58) Field of Classification Search ............. 361/679.53, 361/699, 698, 701, 702, 724–727; 165/80.4–80.5, 165/104.33; 257/714–716; 62/259.2; 174/15.1, 174/17 LF
See application file for complete search history.

(56) References Cited

U.S. PATENT DOCUMENTS

| | | | |
|---|---|---|---|
| 2,125,888 A | 8/1938 | Cordrey |
| 2,512,545 A | 6/1950 | Hazard |
| 2,548,325 A | 4/1951 | Smith |
| 2,643,282 A | 6/1953 | Green |
| 2,791,888 A | 5/1957 | Vani |
| 3,109,485 A | 11/1963 | Fortier |

(Continued)

FOREIGN PATENT DOCUMENTS

DE    101 12 389 A1    10/2002

(Continued)

OTHER PUBLICATIONS

Office Action for U.S. Appl. No. 12/256,631 (U.S. Patent Publication No. 2010/0103614 A1), dated Apr. 21, 2010.

(Continued)

*Primary Examiner* — Zachary M Pape
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for facilitating pumped, immersion-cooling of an electronic subsystem having multiple different types of components to be immersion-cooled. The apparatus includes a container sized to receive the electronic subsystem, and a coolant inlet port and a coolant outlet port for facilitating ingress and egress of coolant through the container. The apparatus further includes a coolant pump assembly coupled in fluid communication with the coolant inlet and outlet ports of the container for facilitating active pumping of coolant through the container. When the electronic subsystem is operatively inserted into the container and coolant is pumped through the container, the multiple different types of components of the electronic subsystem are immersion-cooled by the coolant. In one embodiment, a filler element is disposed within the container, and is sized to reduce the amount of coolant within the container, while still maintaining the components of the electronic subsystem immersion-cooled.

20 Claims, 7 Drawing Sheets

U.S. PATENT DOCUMENTS

| | | | |
|---|---|---|---|
| 3,143,592 A | 8/1964 | August | |
| 3,226,941 A | 1/1966 | Snelling | |
| 3,404,730 A | 10/1968 | Kurisu | |
| 3,476,175 A | 11/1969 | Plevyak | |
| 3,512,582 A | 5/1970 | Chu et al. | |
| 3,578,014 A | 5/1971 | Gachot | |
| 3,586,101 A | 6/1971 | Chu et al. | |
| 3,600,636 A | 8/1971 | Petersen | |
| 3,609,991 A | 10/1971 | Chu et al. | |
| 3,774,677 A | 11/1973 | Antonetti et al. | |
| 3,858,090 A | 12/1974 | Lehmann | |
| 4,064,300 A | 12/1977 | Bhangu | |
| 4,108,242 A | 8/1978 | Searight et al. | |
| 4,201,195 A | 5/1980 | Sakhuja | |
| 4,302,793 A | 11/1981 | Rohner | |
| 4,430,866 A | 2/1984 | Willitts | |
| 4,590,538 A | 5/1986 | Cray, Jr. | |
| 4,619,316 A | 10/1986 | Nakayama et al. | |
| 4,622,946 A | 11/1986 | Hurley et al. | |
| 4,694,378 A | 9/1987 | Nakayama et al. | |
| 4,704,658 A | 11/1987 | Yokouchi et al. | |
| 4,741,385 A | 5/1988 | Bergles et al. | |
| 4,750,086 A | 6/1988 | Mittal | |
| 4,912,600 A | 3/1990 | Jaeger et al. | |
| 4,928,206 A | 5/1990 | Porter et al. | |
| 4,928,207 A | 5/1990 | Chrysler et al. | |
| 4,962,444 A | 10/1990 | Niggemann | |
| 5,021,924 A | 6/1991 | Kieda et al. | |
| 5,057,968 A | 10/1991 | Morrison | |
| 5,063,476 A | 11/1991 | Hamadah et al. | |
| 5,067,047 A | 11/1991 | Azar | |
| 5,126,919 A | 6/1992 | Yamamoto et al. | |
| 5,168,348 A | 12/1992 | Chu et al. | |
| 5,183,104 A | 2/1993 | Novotny | |
| 5,220,804 A | 6/1993 | Tilton et al. | |
| 5,270,572 A | 12/1993 | Nakajima et al. | |
| 5,274,530 A | 12/1993 | Anderson | |
| 5,305,184 A | 4/1994 | Anderesen et al. | |
| 5,349,831 A | 9/1994 | Daikoku et al. | |
| 5,406,807 A | 4/1995 | Ashlwake et al. | |
| 5,414,592 A | 5/1995 | Stout et al. | |
| 5,458,185 A | 10/1995 | Mizuno | |
| 5,467,250 A | 11/1995 | Howard et al. | |
| 5,491,363 A | 2/1996 | Yoshikawa | |
| 5,675,473 A * | 10/1997 | McDunn et al. | 361/699 |
| 5,687,577 A | 11/1997 | Ballard et al. | |
| 5,718,117 A | 2/1998 | McDunn et al. | |
| 5,782,101 A | 7/1998 | Dennis | |
| 5,825,621 A | 10/1998 | Giannatto et al. | |
| 5,829,264 A | 11/1998 | Ishigaki et al. | |
| 5,854,092 A | 12/1998 | Root et al. | |
| 5,860,602 A | 1/1999 | Tilton et al. | |
| 5,864,466 A | 1/1999 | Remsburgh | |
| 5,880,931 A | 3/1999 | Tilton et al. | |
| 5,907,473 A | 5/1999 | Przilas et al. | |
| 5,943,211 A | 8/1999 | Havey et al. | |
| 5,959,351 A | 9/1999 | Sasaki et al. | |
| 5,963,425 A | 10/1999 | Chrysler et al. | |
| 5,970,731 A | 10/1999 | Hare et al. | |
| 6,000,908 A | 12/1999 | Bunker | |
| 6,016,969 A | 1/2000 | Tilton et al. | |
| 6,019,167 A | 2/2000 | Bishop et al. | |
| 6,026,565 A | 2/2000 | Giannatto et al. | |
| 6,052,284 A * | 4/2000 | Suga et al. | 361/699 |
| 6,055,157 A | 4/2000 | Bartilson | |
| 6,139,361 A | 10/2000 | Przilas et al. | |
| 6,173,577 B1 | 1/2001 | Gold | |
| 6,193,905 B1 | 2/2001 | Yamada et al. | |
| 6,205,799 B1 | 3/2001 | Patel et al. | |
| 6,212,895 B1 | 4/2001 | Richardson | |
| 6,320,744 B1 | 11/2001 | Sullivan et al. | |
| 6,349,554 B2 | 2/2002 | Patel et al. | |
| 6,366,462 B1 | 4/2002 | Chu et al. | |
| 6,378,605 B1 | 4/2002 | Kutcher et al. | |
| 6,392,891 B1 | 5/2002 | Tzil et al. | |
| 6,393,853 B1 | 5/2002 | Vukovic et al. | |
| 6,404,640 B1 | 6/2002 | Ishimine et al. | |
| 6,431,260 B1 | 8/2002 | Agonafer et al. | |
| 6,457,321 B1 | 10/2002 | Patel et al. | |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 | 6/2003 | Rini et al. | |
| 6,574,104 B2 | 6/2003 | Patel et al. | |
| 6,581,388 B2 | 6/2003 | Novotny et al. | |
| 6,616,469 B2 | 9/2003 | Goodwin et al. | |
| 6,621,707 B2 | 9/2003 | Ishimine et al. | |
| 6,644,058 B2 | 11/2003 | Bash et al. | |
| 6,646,879 B2 | 11/2003 | Pautsch | |
| 6,807,056 B2 | 10/2004 | Kondo et al. | |
| 6,817,196 B2 | 11/2004 | Malone et al. | |
| 6,828,675 B2 | 12/2004 | Memory et al. | |
| 6,927,980 B2 | 8/2005 | Fukuda et al. | |
| 6,955,062 B2 | 10/2005 | Tilton et al. | |
| 6,973,801 B1 | 12/2005 | Campbell et al. | |
| 6,976,528 B1 | 12/2005 | Tilton et al. | |
| 7,011,143 B2 | 3/2006 | Corrado et al. | |
| 7,012,807 B2 | 3/2006 | Chu et al. | |
| 7,057,893 B2 * | 6/2006 | Nicolai et al. | 361/699 |
| 7,079,393 B2 | 7/2006 | Colgan et al. | |
| 7,088,585 B2 | 8/2006 | Chu et al. | |
| 7,104,078 B2 | 9/2006 | Tilton | |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges et al. | |
| 7,191,954 B2 | 3/2007 | Kline | |
| 7,222,502 B2 | 5/2007 | Kobayashi et al. | |
| 7,233,491 B2 | 6/2007 | Faneuf et al. | |
| 7,251,139 B2 * | 7/2007 | Bhattacharya et al. | 361/719 |
| 7,252,100 B1 | 8/2007 | Downes et al. | |
| 7,258,161 B2 | 8/2007 | Cosley et al. | |
| 7,272,005 B2 | 9/2007 | Campbell et al. | |
| 7,285,851 B1 * | 10/2007 | Cepeda-Rizo et al. | 257/712 |
| 7,286,356 B2 | 10/2007 | Keenan et al. | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 | 4/2008 | Pfahnl | |
| 7,362,574 B2 | 4/2008 | Campbell et al. | |
| 7,365,973 B2 | 4/2008 | Rasmussen et al. | |
| 7,372,698 B1 | 5/2008 | Tilton et al. | |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 | 7/2008 | Tilton et al. | |
| 7,392,823 B2 | 7/2008 | Dong et al. | |
| 7,400,505 B2 | 7/2008 | Campbell et al. | |
| 7,408,776 B2 | 8/2008 | Campbell et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,384 B2 | 11/2008 | Tavassoli et al. | |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 | 2/2009 | Tilton et al. | |
| 7,531,142 B2 | 5/2009 | Huziwara et al. | |
| 7,559,207 B2 | 7/2009 | Knight et al. | |
| 7,602,608 B2 | 10/2009 | Tilton et al. | |
| 7,630,795 B2 | 12/2009 | Campbell et al. | |
| 7,639,499 B1 | 12/2009 | Campbell et al. | |
| 7,641,101 B2 | 1/2010 | Campbell et al. | |
| 7,654,100 B2 | 2/2010 | Rini et al. | |
| 7,660,109 B2 | 2/2010 | Iyengar et al. | |
| 7,724,524 B1 | 5/2010 | Campbell et al. | |
| 2002/0062945 A1 | 5/2002 | Hocker et al. | |
| 2003/0230401 A1 * | 12/2003 | Pfister et al. | 165/104.33 |
| 2004/0008490 A1 | 1/2004 | Cheon | |
| 2004/0057211 A1 | 3/2004 | Kondo et al. | |
| 2005/0207116 A1 | 9/2005 | Yatskov et al. | |
| 2005/0244280 A1 | 11/2005 | Malone et al. | |
| 2005/0254214 A1 | 11/2005 | Salmon | |
| 2006/0126296 A1 | 6/2006 | Campbell et al. | |
| 2006/0162365 A1 | 7/2006 | Hoang et al. | |
| 2006/0180300 A1 | 8/2006 | Lenehan et al. | |

| | | | |
|---|---|---|---|
| 2007/0025081 A1 | 2/2007 | Berlin et al. | |
| 2007/0035937 A1 | 2/2007 | Colbert et al. | |
| 2007/0121295 A1 | 5/2007 | Campbell et al. | |
| 2007/0159797 A1 | 7/2007 | Teneketges et al. | |
| 2007/0193300 A1 | 8/2007 | Tilton et al. | |
| 2007/0199204 A1 | 8/2007 | Knight et al. | |
| 2007/0199340 A1 | 8/2007 | Knight et al. | |
| 2007/0201210 A1 | 8/2007 | Chow et al. | |
| 2007/0291452 A1 | 12/2007 | Gilliland et al. | |
| 2007/0295480 A1 | 12/2007 | Campbell et al. | |
| 2007/0297136 A1 | 12/2007 | Konshak | |
| 2008/0002363 A1 | 1/2008 | Campbell et al. | |
| 2008/0018212 A1 | 1/2008 | Spearing et al. | |
| 2008/0024991 A1 | 1/2008 | Colbert et al. | |
| 2008/0062639 A1 | 3/2008 | Campbell et al. | |
| 2008/0123297 A1* | 5/2008 | Tilton et al. | 361/700 |
| 2008/0158818 A1* | 7/2008 | Clidaras et al. | 361/699 |
| 2008/0196868 A1 | 8/2008 | Attlesey et al. | |
| 2008/0209931 A1 | 9/2008 | Stevens | |
| 2008/0225478 A1 | 9/2008 | Goettert et al. | |
| 2009/0080173 A1 | 3/2009 | Schmidt et al. | |
| 2009/0086428 A1 | 4/2009 | Campbell et al. | |
| 2009/0086432 A1 | 4/2009 | Campbell et al. | |
| 2009/0126909 A1 | 5/2009 | Ellsworth, Jr. et al. | |
| 2009/0126910 A1 | 5/2009 | Campbell et al. | |
| 2009/0133866 A1 | 5/2009 | Campbell et al. | |
| 2009/0238235 A1 | 9/2009 | Campbell et al. | |
| 2009/0260777 A1 | 10/2009 | Attlesey | |
| 2009/0268404 A1 | 10/2009 | Chu et al. | |
| 2009/0314467 A1 | 12/2009 | Campbell et al. | |
| 2009/0316360 A1 | 12/2009 | Campbell et al. | |
| 2010/0101759 A1 | 4/2010 | Campbell et al. | |
| 2010/0101765 A1 | 4/2010 | Campbell et al. | |
| 2010/0103614 A1 | 4/2010 | Campbell et al. | |
| 2010/0103620 A1 | 4/2010 | Campbell et al. | |
| 2010/0246118 A1 | 9/2010 | Attlesey | |

FOREIGN PATENT DOCUMENTS

| | | |
|---|---|---|
| JP | 8-254512 A | 10/1996 |
| JP | 2002-374086 | 12/2002 |

OTHER PUBLICATIONS

RD 323064 A, Mar. 10, 1991, English Document.

International Application No. PCT/EP2009/060792, filed Aug. 20, 2009. Notification of International Search Report, dated Dec. 23, 2009.

Campbell et al., "Liquid-Based Cooling Apparatus for an Electronics Rack", U.S. Appl. No. 11/763,678, filed Jun. 15, 2007.

Iyengar et al., "Apparatus and Method for Facilitating Cooling of an Electronics System", U.S. Appl. No. 11/957,619, filed Dec. 17, 2007.

Goettert et al., "Heat Exchange System for Blade Server Systems and Method", U.S. Appl. No. 12/038,025, filed Feb. 27, 2008.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chef, B., "Supermicro Water Cooled Blades", Info World, Geeks in Paradise, (Mar. 5, 2008), http://weblog.infoworld.com/geeks/archives/2008/03.

Campbell et al., "Liquid Cooling Apparatus and Method of Facilitating Cooling of an Electronic System", U.S. Appl. No. 12/168,259, filed Jul. 7, 2008.

Hwang, U., "Heat Exchanger for Vapor Condensation by Dropwise Technique", IBM Technical Disclosure Bulletin, Publication No. IPCOM000089717D (Dec. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices", Electronics Cooling Magazine, online article retrieved from http://electronics-cooling.com/html12009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering—Refrigeration and Air Conditioning, EECI (2007).

Campbell et al., "Condenser Fin Structures Facilitating Vapor Condensation Cooling of Coolant", U.S. Appl. No. 12/491,286, filed Jun. 25, 2009.

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Adjusting Coolant Flow Resistance Through Liquid-Cooled Electronics Rack(s)", U.S. Appl. No. 12/556,040, filed Sep. 9, 2009.

Campbell et al., "Apparatus and Method with Forced Coolant Vapor Movement for Facilitating Two-Phase Cooling of an Electric Device", U.S. Appl. No. 12/565,175, filed Sep. 23, 2009.

Campbell et al., "Liquid-Cooled Electronics Apparatus and Methods of Fabrication", U.S. Appl. No. 12/556,081, filed Sep. 24, 2009.

Campbell et al., "Compliant Conduction Rail Assembly and Method Facilitating Cooling of an Electronics Structure", U.S. Appl. No. 12/570,215, filed Sep. 30, 2009.

Campbell et al., "Cooled Electronic Module with Pump-Enhanced, Dielectric Fluid Immersion-Cooling", U.S. Appl. No. 12/491,281, filed Jun. 25, 2009.

Campbell et al., "System and Method for Standby Mode Cooling of a Liquid-Cooled Electronics Rack", U.S. Appl. No. 12/567,954, filed Sep. 28, 2009.

Campbell et al., "Cooling System and Method Minimizing Power Consumption in Cooling Liquid-Cooled Electronics Racks", U.S. Appl. No. 12/556,066, filed Sep. 9, 2009.

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

Office Action for U.S. Appl. No. 12/256,605 (U.S. Patent Publication No. 2010/0103620 Al), dated Aug. 10, 2010.

Office Action for U.S. Appl. No. 12/256,618 (U.S. Patent Publication No. 2010/0101759 A1), dated Aug. 30, 2010.

Office Action U.S. Appl. No. 12/256,623 (U.S. Patent Publication No. 2010/0101765 A1), dated Nov. 5, 2010.

Notice of Allowance for U.S. Appl. No. 12/256,618 (U.S. Publication No. 2010/0101759 A1), dated Feb. 10, 2011.

* cited by examiner

APPARATUS AND METHOD FOR FACILITATING PUMPED IMMERSION-COOLING OF AN ELECTRONIC SUBSYSTEM

TECHNICAL FIELD

The present invention relates to apparatuses and methods for facilitating cooling of an electronics system, such as a multi-blade center system, and more particularly, to apparatuses and methods for facilitating pumped immersion-cooling of one or more electronic subsystems of an electronic system chassis.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air that is exhausted into the computer center.

In many server applications, processors along with their associated electronics (e.g., memory, disc drives, power supplies, etc.) are packaged in removable drawer or blade configurations disposed within a housing. Typically, the components are cooled by air moving in parallel air flow paths, usually front-to-back, impelled by one or more air-moving devices (e.g., fans or blowers). In some cases, it may be possible to handle increased power dissipation within a single drawer or blade chassis by providing greater air flow, through the use of a more powerful air-moving device, or by increasing the rotational speed (i.e., RPMs) of an existing air-moving device. However, this approach is becoming problematic at the system level.

The sensible heat load carried by air exiting the electronics rack is stressing the ability of room air-conditioning to effectively handle the load. This is especially true for large installations with "server farms" or large banks of computer racks close together. In such installations, liquid cooling of selected components is an attractive technology to manage the higher heat fluxes. The liquid coolant absorbs the heat dissipated by selected components/modules in an efficient manner. Typically, the absorbed heat is ultimately transferred from the liquid to an outside environment, whether air or liquid-cooled.

SUMMARY OF THE INVENTION

The shortcomings of the prior art are overcome and additional advantages are provided through the provision of an apparatus for facilitating cooling of an electronic subsystem. The apparatus includes a container sized to receive an electronic subsystem therein, and the electronic subsystem includes multiple different types of components to be cooled. The apparatus further includes a coolant inlet port and a coolant outlet port coupled to the container and a coolant pump assembly. The coolant inlet and outlet ports facilitate ingress and egress of coolant through the container, wherein when the electronic subsystem is operatively inserted into the container and coolant flows therethrough, the multiple different types of components of the electronic subsystem are immersion-cooled by the coolant. The coolant pump assembly is coupled in fluid communication with the coolant inlet port and the coolant outlet port of the container for facilitating active pumping of coolant through the container for pumped immersion-cooling of the electronic subsystem when operatively disposed therein.

In another aspect, a cooled electronics rack is provided. The cooled electronics rack includes an electronics rack, at least one electronic system chassis, at least one electronic subsystem, and an apparatus for facilitating cooling of the at least one electronic subsystem. The electronics rack at least partially surrounds and supports the at least one electronic system chassis, which includes the at least one electronic subsystem, and each electronic subsystem includes multiple different types of components to be cooled. Each apparatus includes a container sized to receive a respective electronic subsystem, and a coolant inlet port and a coolant outlet port coupled to the container for facilitating ingress and egress of coolant through the container, wherein when the respective electronic subsystem is operatively inserted into the container and coolant flows therethrough, the multiple different types of components of the electronic subsystem are immersion-cooled by the coolant. The cooled electronics rack further includes a coolant pump assembly coupled in fluid communication with the coolant inlet and the coolant outlet port of each container for facilitating active pumping of coolant through the container to provide pumped immersion-cooling of the respective electronic subsystem when operatively disposed therein.

In a further aspect, a method is provided for facilitating cooling of an electronic subsystem comprising multiple different types of components to be immersion-cooled. The method includes: providing a container sized to receive an electronic subsystem therein, the container comprising a coolant inlet port and a coolant outlet port coupled to the container for facilitating ingress and egress of coolant through the container, the electronic subsystem comprising multiple different types of components to be immersion-cooled; and coupling a coolant pump assembly in fluid communication with the coolant inlet port and the coolant outlet port to facilitate active pumping of coolant through the container to provide pumped immersion-cooling of the multiple different types of components of the electronic subsystem when the electronic subsystem is operatively disposed within the container.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
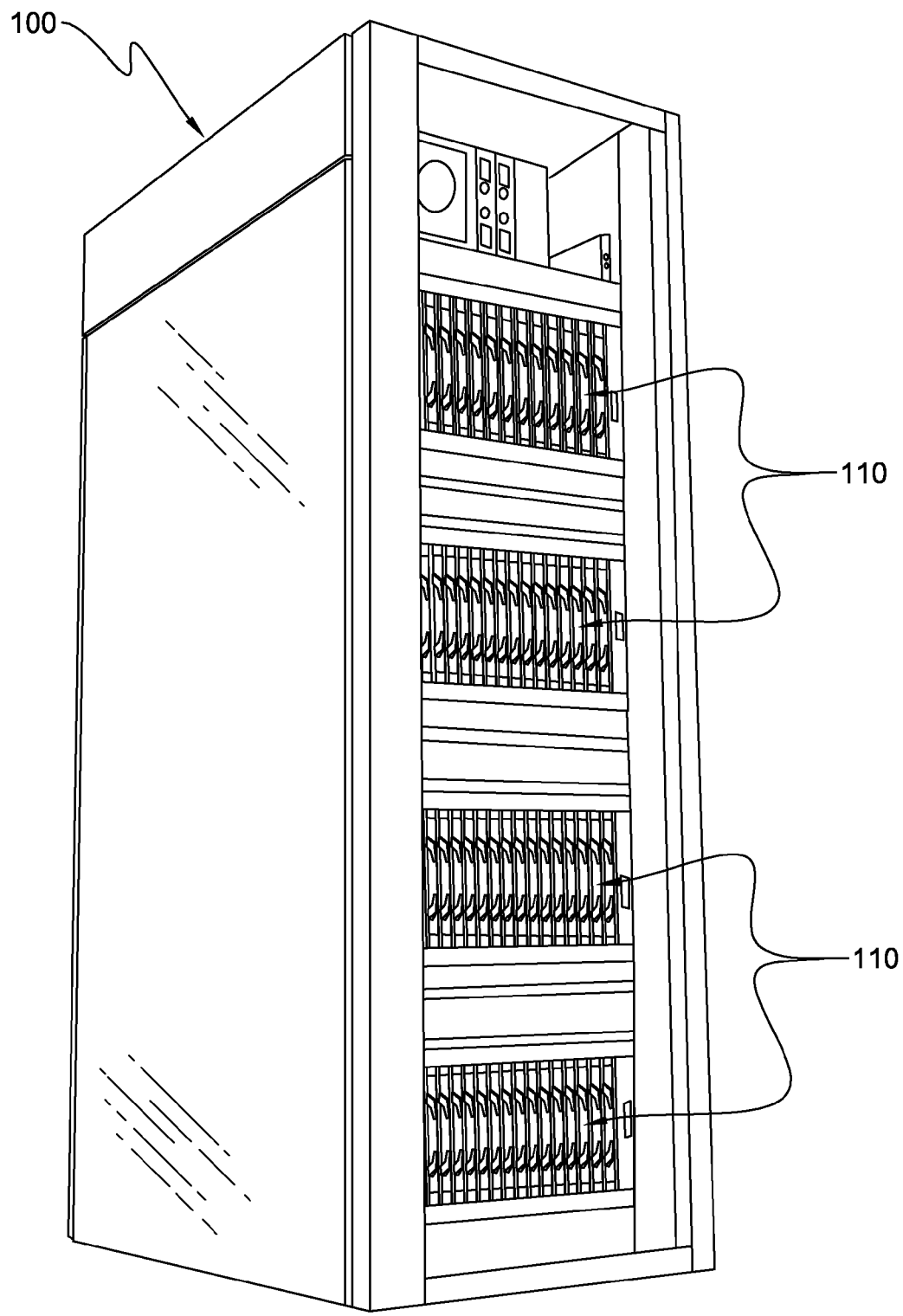
FIG. 1A depicts one embodiment of an electronics rack employing a stack of multiple-blade center systems to receive pumped coolant, in accordance with an aspect of the present invention.

As used herein, the term "electronics rack", includes any housing, frame, rack, compartment, blade server system, etc., having one or more heat generating components of a computer system, and may be, for example, a stand alone computer processor having high, mid or low end processing capability. In one embodiment, an electronics rack may comprise multiple electronic system chassis, each having multiple heat generating components or blades disposed therein requiring cooling. As one example, an electronic system chassis may be a multi-blade center system. The blades or subsystems of each multi-blade center system may be removable, and comprise multiple different types of components to be liquid-cooled. In one example, one or more blades of a multi-blade center system are immersion-cooled blades. "Immersion-cooled electronic subsystem" or "immersion-cooled blade" refers to any blade, book, node, etc., having multiple different types of components thereof directly cooled by common immersion within coolant flowing around, over, through or across the components. In one instance, one or more surfaces of each component of the multiple different types of components is in direct physical contact with the coolant to facilitate transfer of heat from the component to the coolant.

One example of a liquid-cooled electronics rack employing immersion-cooled electronic subsystems is described in co-filed, commonly assigned U.S. patent application entitled "Liquid Cooling Apparatus and Method for Cooling Blades of an Electronic System Chassis", Ser. No. 12/256,623, filed Oct. 23, 2008, published on Apr. 29, 2010, as U.S. Patent Publication No. 2010/0101765 A1, while one detailed example of an immersion-cooled blade is described and depicted in co-filed, commonly assigned U.S. patent application entitled "Apparatus and Method for Facilitating Immersion-Cooling of an Electronics Subsystem", Ser. No. 12/256,618, filed Oct. 23, 2008, published on Apr. 29, 2010, as U.S. patent Publication No. 2010/0101759 A1, the entirety of each of which is hereby incorporated herein by reference. Multiple components of an immersion-cooled electronic subsystem may be directly immersion-cooled by the coolant or indirectly immersion-cooled. Indirect immersion-cooling refers to the existence of a thermal cap, thermal spreader, passivation layer, or other surface interposed between one surface of the component and the coolant within which the component is immersed. In one instance, immersion of the component within the coolant means that the coolant flows over multiple surfaces of the component.

As a further example, an electronic subsystem may comprise a main circuit board or motherboard with a plurality of different types of discrete devices operatively connected thereto. A blade server for a multi-blade center system is one detailed example of an electronic subsystem to be immersion-cooled.

As used herein, "heat exchanger" refers to any heat exchange assembly through which a first coolant and a second coolant can circulate. In one embodiment, the first coolant is a liquid coolant, and the second coolant is a two-phase dielectric coolant, which may undergo condensation within the heat exchanger. Size, configuration and construction of the heat exchanger can vary without departing from the scope of the invention disclosed herein.

One example of a liquid coolant flowing through the first coolant path is facility-chilled water, and one example of a two-phase coolant flowing through the second coolant path is a two-phase dielectric coolant. For example, the two-phase dielectric coolant may comprise a fluorocarbon or segregated hydrofluoroether liquid (e.g., FC-86, FC-87, FC-72, HFE-7000, HFE-7100, or HFE-7200, each of which is available from 3M Corporation, St. Paul, Minn., USA). Fluorocarbon liquid typically boils at 30° C.-80° C. at atmospheric pressure, while water boils at 100° C. Those skilled in the art should note, however, that the concepts disclosed herein are readily adapted to other types of first coolant and second coolant. For example, one or more of the coolants may comprise a brine, a liquid metal, or similar coolant, or a refrigerant, while still maintaining various advantages and unique features of the present invention.

Reference is made below to the drawings, which are not drawn to scale and are simplified for ease of understanding, and wherein the same reference numbers used throughout different figures designate the same or similar components.

FIG. 1A depicts one embodiment of an electronics rack 100 comprising a stack of electronic system chassis or multi-blade center systems 110, as well as supporting power supplies, networking equipment, etc.

Figure 1B:
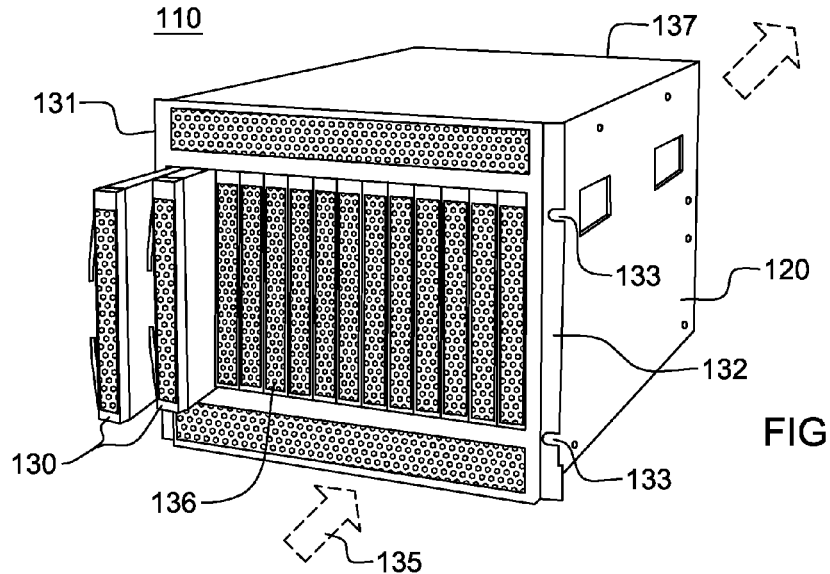
FIG. 1B is an isometric view of one embodiment of one multi-blade center system of the electronics rack of FIG. 1A.

FIG. 1B illustrates one embodiment of multi-blade center system 110, one example of which is marketed by International Business Machines Corporation, of Armonk, N.Y. By way of specific example, multi-blade center system 110 may comprise a stand alone server system which incorporates scalable computing functionality up to, for example, fourteen high performance servers (or blades).

As shown in FIG. 1B, multi-blade center system 110 includes a system chassis 120 and multiple removable blades 130. As one example, each removable blade 130 is an electronics subsystem, such as a server of a multi-server electronics system. A first flange 131 and second flange 132 with openings 133 are also illustrated. Typically, flanges 131, 132 are used to secure the multi-blade center system within an electronics rack, such as depicted in FIG. 1A. Airflow 135 is conventionally provided through an air inlet side 136 of multi-blade center system 110 to an air outlet side 137, and is typically established, for example, by two or more air-moving devices (not shown) disposed at the back portion of the system housing. Electrical and networking infrastructure is also located near the back of system chassis 120.

Figure 1C:
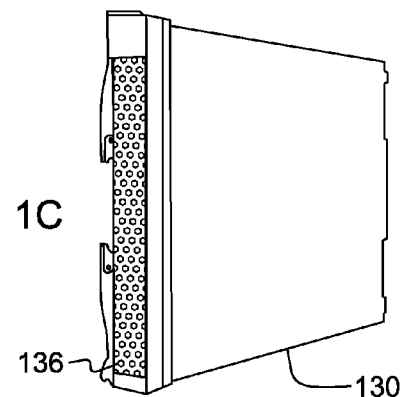
FIG. 1C is an isometric view of one embodiment of an individual removable blade of a multi-blade center system of FIG. 1B.
Figure 1D:
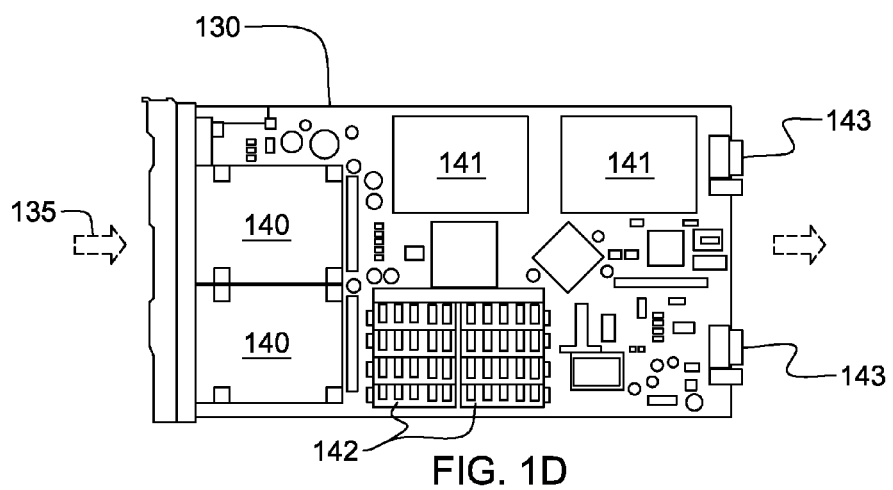
FIG. 1D is a side elevational view of one embodiment of the removable blade of FIG. 1C.

FIGS. 1C & 1D depict one embodiment of a removable blade 130 of the electronic system chassis. As illustrated in FIG. 1D, removable blade 130 includes, for example, multiple processors above which conventionally reside respective air-cooled heat sinks 140. In this example, each removable blade is a complete computer system, or subsystem, and includes, for example, Direct Access Storage Device (DASD) 141 and Dual In-Line Memory Modules (DIMMs) 142. Electrical connectors 143 are provided for electrically connecting blade 130 to the respective electronic system chassis 120 (FIG. 1B). Corresponding electrical connectors are disposed within the electronic system chassis near the back thereof for making electrical connection to connectors 143 when the blade is inserted into the chassis in operational position.

By way of specific example, a typical blade center chassis today is 9 U tall (where 1 U equals 1.75 inches or 44.45 mm) and houses 14 field-replaceable blades, each containing two central processing units (CPUs). A standard electronics rack that is 42 U tall can thus accommodate four such blade center chassis (each 9 U tall), for a total of 56 blades and 112 CPU modules. International Business Machines Corporation markets three versions of a blade center chassis, namely, the BC, BCH and BC-Telco versions. FIGS. 1A-1D illustrate one example of a BCH chassis marketed by International Business Machines Corporation, however, the concepts presented herein are readily applicable to any blade center chassis configuration, as well as to other electronic system housing variants. Further, the liquid cooling apparatus described herein is readily adaptable to use with any housing version with multiple components to be immersion-cooled.

Advantageously, liquid cooling of a multi-blade center system, or an electronics rack such as depicted in FIG. 1A, provides increased cooling at the module and rack level, and enables higher performance systems than currently feasible using air-cooling. Further, a liquid cooling apparatus, such as described below, improves energy efficiency by eliminating or reducing requirements on one or more data center air-conditioning units; that is, by rejecting heat to liquid coolant, which in one example, is subsequently rejected to the ambient environment outside of the data center. With a liquid cooling approach such as described herein, the conventional air-moving devices within the multi-blade center systems and the electronics rack(s) are eliminated, thereby reducing acoustic noise within the data center. Additionally, a reduced form factor of the processor's thermal solution is provided, thus allowing more functionality to be packaged within a single subsystem or blade. This added functionality could be memory, hard drives, or other devices, which would allow for a more competitive offering within the market place.

Co-pending U.S. patent application Ser. No. 12/168,259, filed Jul. 7, 2008, entitled "Liquid Cooling Apparatus and Method for Facilitating Cooling of an Electronic System", which is hereby incorporated herein by reference, discloses forced liquid cooling of selected components of one or more electronic system chassis. Disclosed hereinbelow is a pumped liquid cooling apparatus which achieves 100% liquid cooling of, for example, the blades of a multi-blade center system, whether as a stand alone system, or stacked within an electronics rack with other multi-blade center systems.

Figure 2:
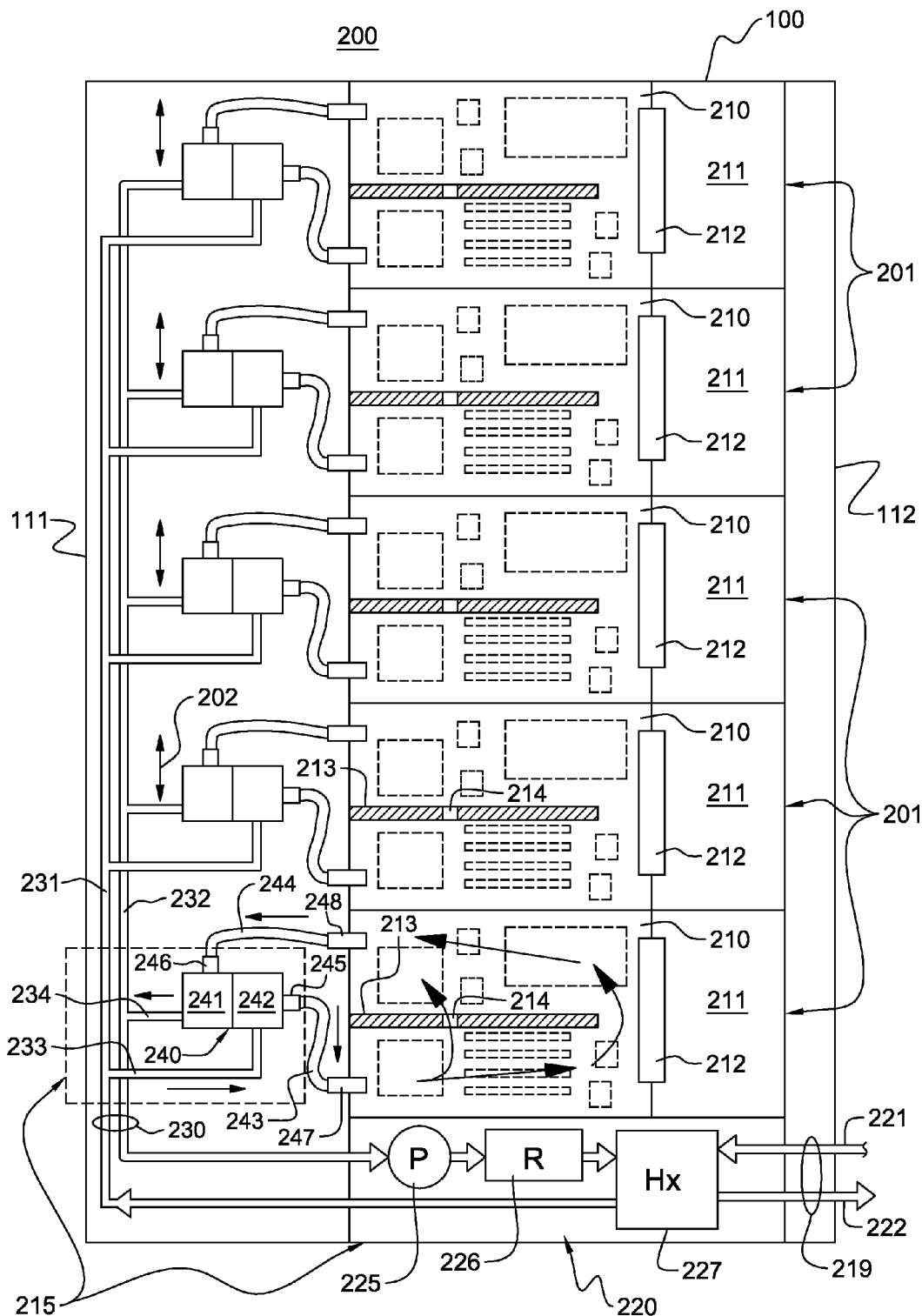
FIG. 2 is a schematic of one embodiment of a cooled electronics rack, comprising (in the illustrated embodiment) a stack of multi-blade center systems and a immersion-cooling apparatus, in accordance with an aspect of the present invention.

FIG. 2 is a schematic of one embodiment of a cooled electronics rack, generally denoted 200, in accordance with an aspect of the present invention. Cooled electronics rack 200 includes an electronics rack 100 having a plurality of multi-blade center systems 201 stacked within the rack. In this example, five multi-blade center systems 201 are illustrated, with each system being an example of an electronic system chassis. As illustrated in FIG. 2, each multi-blade center system 201 includes a back plane 212, into which respective removable immersion-cooled blades 210 are electrically, operatively inserted, and a back space 211 which conventionally would accommodate one or more air-moving devices (not shown) to cause airflow to flow from a front side 111 to a back side 112 of electronics rack 100 through the multi-blade center system 201.

One embodiment of an immersion-cooling apparatus, generally denoted 215, is illustrated in FIG. 2. In this embodiment, a rack-mounted, coolant conditioning unit 220 is disposed in a lower portion of electronics rack 100. Coolant conditioning unit 220 includes, in one example, a pump 225, a reservoir 226 and a heat exchanger 227 coupled in series fluid communication, as illustrated in FIG. 2. In this example, heat exchanger 227 is a liquid-to-liquid heat exchanger which extracts heat from coolant flowing through a first coolant loop 230 of immersion-cooling apparatus 215 and dissipates the heat to a facility coolant loop 219 comprising a facility coolant supply line 221 and facility coolant return line 222. In one example, facility coolant supply line 221 and facility coolant return line 222 couple coolant conditioning unit 220 to a data center facility coolant supply and return (not shown). Coolant conditioning unit 220 may further include an optional filter in fluid communication with first coolant loop 230.

In one embodiment, first coolant loop 230 includes a rack-level inlet manifold 231 and a rack-level outlet manifold 232, which are coupled to coolant conditioning unit 220 via, for example, flexible hoses and respective quick connect couplings. The flexible hoses allow the rack-level manifolds to be mounted within, for example, a door of the electronics rack which is hingedly mounted to the air inlet side of the rack in a manner similar to that described in co-pending, commonly assigned U.S. patent application Ser. No. 11/763,678, filed Jun. 15, 2007, entitled "Liquid-Based Cooling Apparatus for an Electronics Rack", the entirety of which is hereby incorporated herein by reference. In one example, rack-level inlet manifold 231 and rack-level outlet manifold 232 each comprise an elongated, rigid tube vertically mounted to electronics rack 100.

In the embodiment illustrated, the rack-level coolant manifold assembly, comprising rack-level inlet manifold 231 and rack-level outlet manifold 232, is in fluid communication with multiple movable chassis-level manifold assemblies 240. Various examples of movable chassis-level manifold assemblies mounted to an electronics rack are described in the above-incorporated, co-pending U.S. patent application Ser. No. 12/168,259, entitled "Liquid Cooling Apparatus and Method for Facilitating Cooling of an Electronics System". As illustrated in FIG. 2, each movable chassis-level manifold assembly is coupled to the electronics rack to reciprocate vertically (as indicated by arrows 202) adjacent to an associated electronic system chassis to facilitate the removal of individual blades, without impacting cooling of adjacent blades. Respective quick connect couplings may be employed to couple the rack-level inlet manifold and rack-level outlet manifold to each movable chassis-level manifold assembly 240, using for example appropriately sized, flexible rack-level tubing 233, 234. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 240 includes a coolant return manifold 241 and a coolant supply manifold 242 disposed, in one example, within a common structure, but isolated to prevent direct flow of coolant therebetween. Heated coolant returning through coolant return manifold 241 of each chassis-level manifold assembly 240 is transferred via the rack-level outlet manifold 232 to coolant conditioning unit 220, where it is ultimately rejected to facility coolant loop 219. In one example, coolant passing through first coolant loop 230, and hence, coolant passing through the immersion-cooled blades is a two-phase dielectric coolant, such as described above. In the example illustrated, the vertically oriented rack-level inlet and outlet manifolds 231, 232 each have five ports, which connect to five horizontally oriented, movable chassis-level manifold assemblies 240 via respective coolant supply lines 233 and coolant return lines 234. The chassis-level manifold assemblies serve as coolant distribution and collection manifolds supplying and exhausting coolant in parallel to multiple immersion-cooled blades of a respective multi-blade center system 201.

Specifically, each coolant supply manifold 242 of each chassis-level manifold assembly 240 has a plurality of ports, each coupled via flexible tubing 243 to a coolant inlet of a different, respective immersion-cooled blade 210. In one embodiment, flexible tubing 243 couples to a respective supply port of the chassis-level manifold assembly 240 via an appropriate hose barb fitting 245, and couples to the immersion-cooled blade 210 via a quick connect coupling 247. Further, flexible tubing 244 couples a respective return port of a plurality of return ports of the chassis-level manifold assembly 240 to a coolant outlet of the respective immersion-cooled blade 210. At the outlet, a quick connect coupling 248 is employed (in one embodiment) to facilitate connection or disconnection of the corresponding immersion-cooled blade, while at the other end, flexible tubing 244 couples to a respective return port of chassis-level manifold assembly 240 via an appropriate hose barb fitting 246. Flexible tubes 243, 244 are sized and provided with sufficient flexibility to allow the associated movable chassis-level manifold assembly 240 to reciprocate within a designed extent of travel, as illustrated by arrows 202.

As noted, in one example, a two-phase dielectric coolant is employed within immersion-cooled blade 210 and the immersion-cooling apparatus 215. In operation, flexible tubing 244 transports vaporized coolant from the respective immersion-cooled blade 210 to the coolant return manifold 241 of the respective chassis-level manifold assembly. From the respective coolant return manifold 241, the warm vapor-liquid dielectric mixture is returned via the rack-level outlet manifold 232 for forwarding to the rack-mounted, coolant cooling unit 220 for subsequent cooling of the dielectric coolant. The process is continuously repeated in the operational mode, wherein coolant is actively pumped from the coolant cooling unit 220 to the respective chassis-level manifold assemblies 240 for parallel distribution to the immersion-cooled blades 210 of the respective multi-blade center systems 201.

One or more surfaces of electronic components within the blade may be exposed directly (or indirectly) to the surrounding dielectric coolant, and heat transfer takes place via, for example, boiling at one or more surfaces of the different electronic components. In one embodiment, the liquid coolant, and resultant vapor, are directed via one or more centrally extending baffles 213 to an upper portion of the immersion-cooled blade 210, where the vapor rises to the top portion of the blade, and may be directed via one or more vapor deflectors (not shown) back to the outlet port for transport to the respective coolant return manifold, and hence to coolant conditioning unit 220 for condensing and cooling. As explained further below, an opening 214 may be provided in baffle 213 to directly provide a portion of the cooler dielectric coolant from the lower portion of the immersion-cooled blade to the upper portion of the immersion-cooled blade in the region of, for example, a higher heat flux electronic component being immersion-cooled. Flow of the vapor-liquid mixture back to the coolant return manifolds of the respective chassis-level manifold assemblies 240 is facilitated by the active pumping of coolant through the immersion-cooled apparatus and immersion-cooled blades of the cooled electronics rack. The coolant conditioning unit 220 interfaces with the facility coolant loop 219, which in one embodiment, contains sub-ambient chilled water, and provides conditioned dielectric coolant to the supply rack manifold.

FIGS. 3A-3E depict one embodiment of an apparatus 300 for facilitating cooling of an electronic subsystem. Together, apparatus 300 and the electronic subsystem define, in one example, an immersion-cooled blade 210. Referring collectively to FIGS. 3A-3E, apparatus 300 includes a hermetically sealable container 305, which in one embodiment is a polymeric container, designed to encapsulate an electronic subsystem as an immersion-cooled blade 210. Container 305 includes an opening (not shown) to allow insertion or removal of the electronic system into (or from) the container. An appropriately sized and configured cover (not shown) seals to the container once the electronic subsystem is operatively positioned therein. Hermetic sealing of the cover to the container could be achieved, for example, by epoxying the cover to the container once the electronic subsystem is in operative position within the container. In one embodiment, container 305 is sized and configured for slidable operative positioning within a docking area of a respective multi-blade center system. For example, the external surface of container 305 may be configured to mate with the internal structure of the blade-center chassis.

In FIGS. 3A-3E, container 305 is depicted (by way of example only) as a rectangular-shaped housing. A first container wall 306, for example, the front wall of container 305, includes a coolant inlet port 301 and a coolant outlet port 302 extending therethrough. The coolant inlet and outlet ports 301, 302, which are hermetically sealed to first container wall 306, respectively allow ingress and egress of coolant through the container. Container 305 also includes a hermetically sealed electrical connector 310 in a second container wall 307, for example, the back wall of the container. Hermetically sealed electrical connector 310 includes an internal electrical and network connection interface sized and configured to mate with an electrical and network connector disposed at one end of the electronic subsystem to be immersion-cooled within the container. An external electrical and network connector (see FIG. 3E) projects beyond the container 305 to facilitate external electrical and network coupling of the electronic subsystem to, for example, back plane 212 (FIG. 2) of a corresponding electronic subsystem chassis of one multi-blade center system within the cooled electronics rack.

Figure 3B:
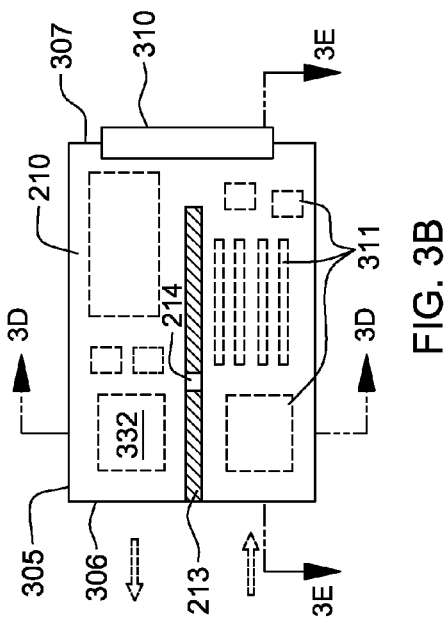
FIG. 3B is a cross-sectional elevational view of the assembly of FIG. 3A, taken along line 3B-3B thereof, in accordance with an aspect of the present invention.
Figure 3C:
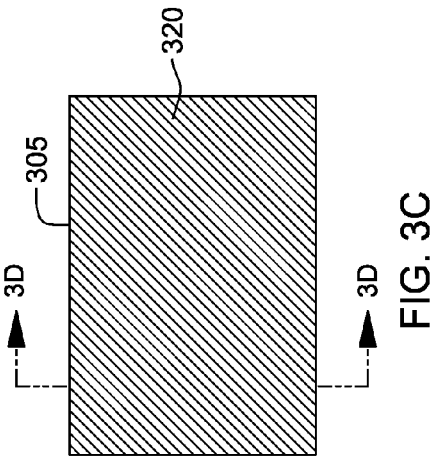
FIG. 3C is a cross-sectional elevational view of the assembly of FIGS. 3A & 3B, taken along line 3C-3C thereof, in accordance with an aspect of the present invention.
Figure 3A:
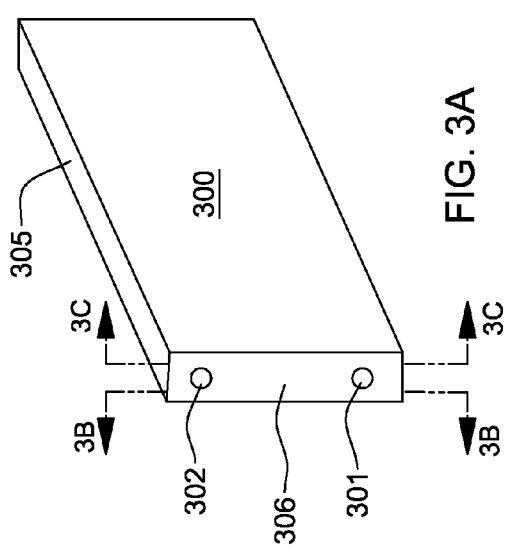
FIG. 3A is an isometric view of one embodiment of a container sized and configured to receive an electronic subsystem for immersion-cooling of multiple different types of components thereof, in accordance with an aspect of the present invention.

As illustrated in FIG. 3A, coolant inlet port 301 and coolant outlet port 302 are, in one embodiment, cylindrical-shaped, and may include hose barb fittings or NPT threaded internal or external portions, to facilitate coupling thereof to a fluid hose or tube via, for example, hose clamp attachments or quick connect couplings. In one implementation, these inlet and outlet ports are inserted and then hermetically sealed into recesses within first container wall 306. Alternatively, the ports can be formed integral with the container body. The interiors of the coolant inlet and outlet ports may comprise cylindrical tubes.

On the opposing, second container wall 307, the internal electrical and network connection interface and external electrical and network connector of hermetically sealed electrical connector 310 are disposed to facilitate providing the electrical and network communication functionality for the electronic subsystem. These fittings are attached to container 305 in a hermetically sealed manner. The internal portion of the hermetically sealed connector 310 is configured to couple to a complementary electrical and network connector of the electronic subsystem to be immersion-cooled. With the electronic subsystem operatively positioned within container 305 and hermetically sealed therein, coolant ingresses and egresses through coolant inlet port 301 and coolant outlet port 302, respectively, extending from one wall of the container, and the external electrical and network connector portion of the hermetically sealed electrical connector 310 extends (in this example) from an opposing wall of the container. In the embodiment illustrated in FIG. 2, the immersion-cooled blades each have inlet and outlet ports located in a vertical plane at the front surface of the container. In operation, the immersion-cooled blades may be partially or totally filled with a dielectric coolant prior to installation of the blades into the electronic subsystem chassis. Coolant lines connect to the two ports of the container via, for example, hose barb fittings, and to the respective chassis-level manifold assembly via quick disconnect couplings (as noted above).

Figure 3D:
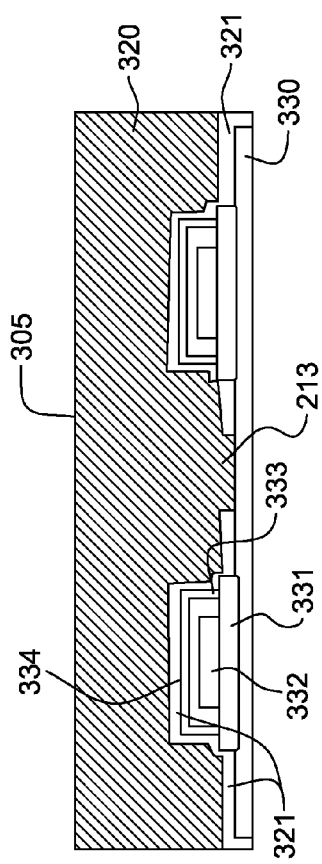
FIG. 3D is a cross-sectional elevational view of the assembly of FIGS. 3A-3C, taken along line 3D-3D of FIGS. 3B & 3C, in accordance with an aspect of the present invention.

As illustrated in FIGS. 2 & 3B, the lower coolant port receives cooled liquid dielectric coolant from the coolant supply manifold of the corresponding chassis-level manifold assembly, and the upper fluid port of the container exhausts a vapor-liquid mixture (in one example) to the coolant return manifold of that chassis-level manifold assembly. FIG. 3B illustrates a cross-sectional elevational view of immersion-cooled blade 210, wherein the electronic subsystem to be immersion-cooled is operatively positioned within container 305. As illustrated in FIG. 3B, the electronic subsystem includes a main circuit board (or motherboard) 330 (FIG. 3D) with multiple different types of electronic components 311 disposed thereon. These multiple different types of electronic components are immersion-cooled by dielectric coolant received through the coolant inlet port 301 of the container 305. Baffle 213 comprises a central portion of a filler element 320, which as illustrated in FIGS. 3B & 3D, contacts the main circuit board, and operates to preferentially direct coolant flow through the container across the multiple different types of electronic components 311 of the electronic subsystem. As illustrated in FIG. 3B, an opening 214 may be provided in central portion 213 of filler element 320 to provide a portion of the cooler dielectric coolant from the lower portion of the immersion-cooled blade to the upper portion of the immersion-cooled blade in the region of a high heat flux electronic component, such as a processor 332 being immersion-cooled.

Figure 3E:
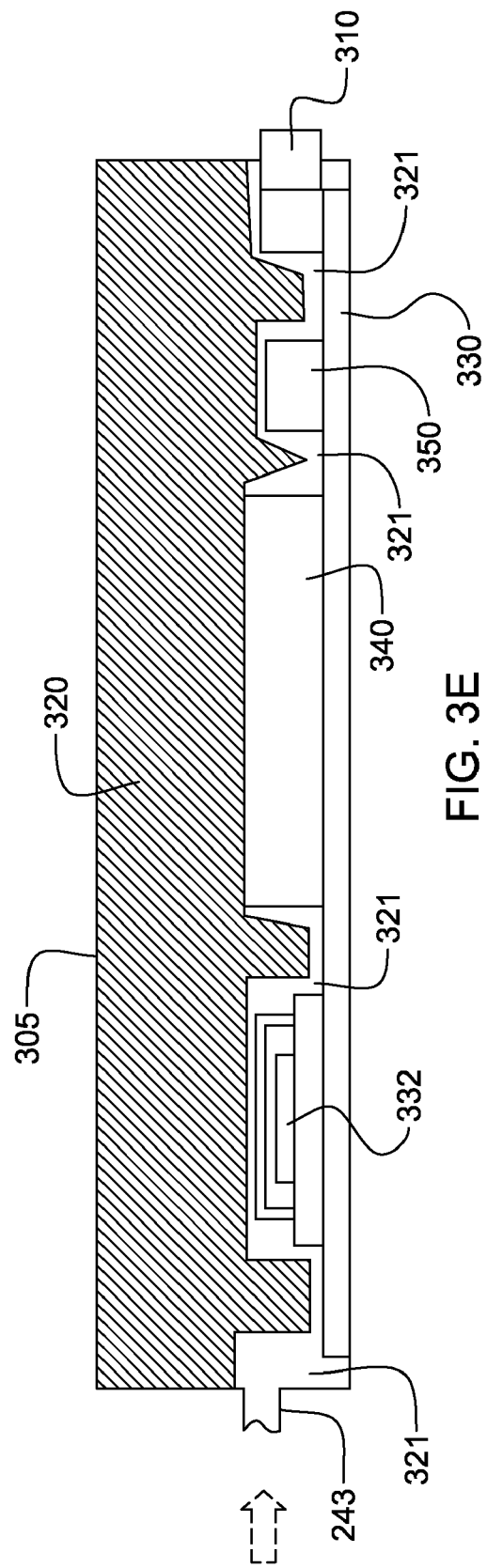
FIG. 3E is a cross-sectional elevational view of the assembly of FIGS. 3A-3D, taken along line 3E-3E of FIG. 3B, in accordance with an aspect of the present invention.

FIGS. 3C-3E depict in greater detail one embodiment of filler element 320, which (in one embodiment) may be a molded filler element or an inflatable filler element sized and configured for disposition within container 305 of apparatus 300. In the embodiment illustrated, filler element 320 fills at least 30% of the container's internal space, thereby reducing a maximum amount of coolant utilized within the container at any time. Advantageously, the filler element reduces the amount of coolant required within the container, while still maintaining the multiple different types of components of the electronic subsystem immersion-cooled by the coolant. Further, in one embodiment, this filler element is sized and configured to direct coolant flow through the container by, for example, defining one or more coolant flow channels 321 between the filler element 320 and the multiple different types of components of the electronic subsystem being immersion-cooled by the coolant. These coolant flow channels 321 are illustrated in FIGS. 3D & 3E. The volume of the container away from the main circuit board 330 is shown in the figures to be occupied by the filler element. This volume would otherwise need to be filled by the expensive and heavy dielectric coolant. The narrow coolant flow channels 321 maintain the coolant close to the heat-producing components, as illustrated in FIGS. 3D & 3E. In FIG. 3D, a cross-sectional view through two processor modules 334 is illustrated. The modules' processors 332 are mounted to a substrate 331, which is supported by main circuit board 330 of the electronic subsystem. Each processor module 334 further includes an encapsulant or cover 333, which (in one embodiment) seals processor 332 from dielectric coolant flowing through the container.

In FIG. 3E, coolant, received via flexible tubing 243, is directed by one or more coolant flow channels 321 to flow directly over and around the multiple different types of components 311 (see FIG. 3B) of the electronic subsystem. In this example, the multiple different types of components to be immersion-cooled include a processor 332, DIMMs 340, DASD 350, and hermetically sealed electrical connector 310.

Figure 4A:
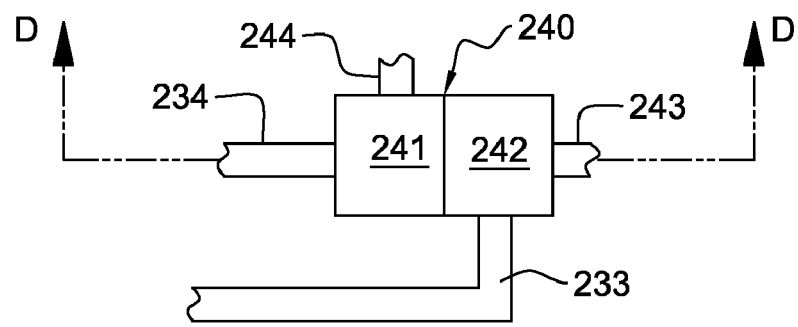
FIG. 4A is an elevational view of one embodiment of a chassis-level manifold assembly of the immersion-cooling apparatus of the cooled electronics rack of FIG. 2, in accordance with an aspect of the present invention.
Figure 4B:
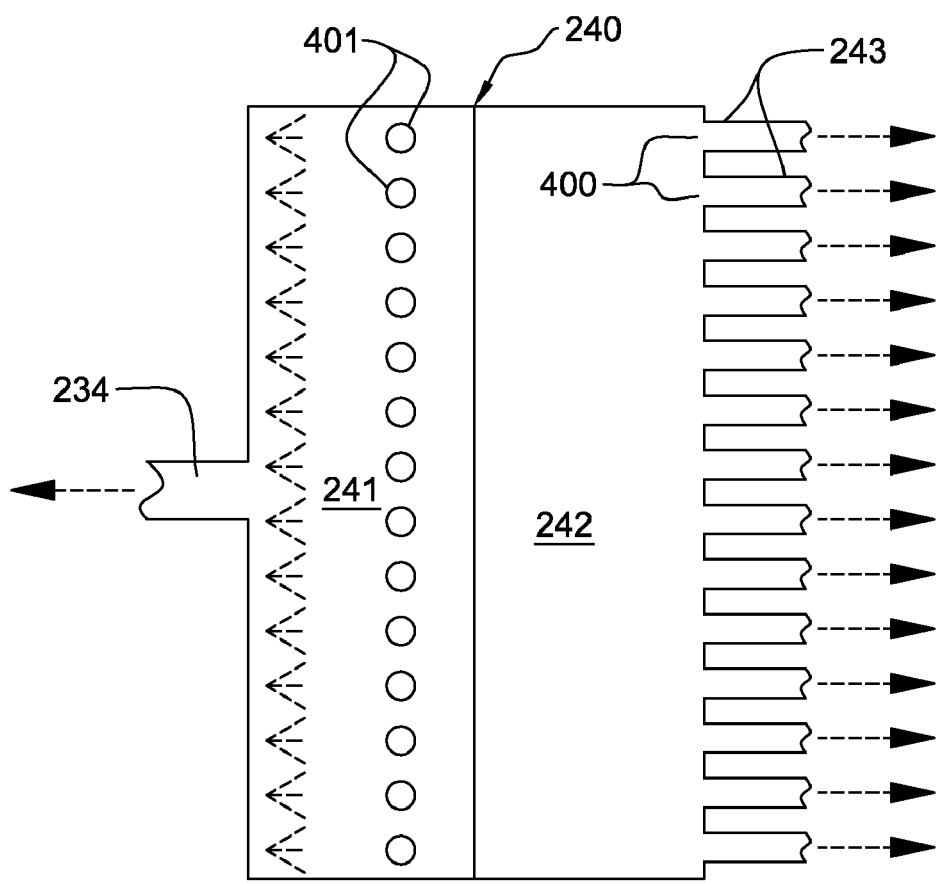
FIG. 4B is a cross-sectional plan view of the chassis-level manifold assembly of FIG. 4A, taken along line 4B-4B thereof, in accordance with an aspect of the present invention.

FIGS. 4A & 4B depict one embodiment of a chassis-level manifold assembly 240, in accordance with an aspect of the present invention. As illustrated in FIG. 4A, chassis-level manifold assembly 240 includes a coolant return manifold 241 and a coolant supply manifold 242, which are fluidically isolated by a wall within the assembly. A coolant supply line 233 couples coolant supply manifold 242 to the rack-level inlet manifold (see FIG. 2), and flexible tubing 243 couples each supply port of coolant supply manifold 242 to a respective immersion-cooled blade, as described above. In operation, cooled liquid dielectric coolant enters coolant supply manifold 242 of the chassis-level manifold assembly and is routed in parallel to the individual immersion-cooled blades via multiple supply ports 400 thereof in fluid communication with the immersion-cooled blades. The warm vapor-liquid coolant mixture is returned back to the coolant return manifold 241 via corresponding flexible hoses 244 coupled in fluid communication with respective return ports 401. The warm vapor-liquid coolant mixture is subsequently forwarded via coolant return line 234 to the rack-level outlet manifold (see FIG. 2). In one embodiment, the flexible hoses 244 possess quick disconnect couplings at the chassis-level manifold assembly and, for example, hose clamp connections at the immersion-cooled blade end.

Figure 5:
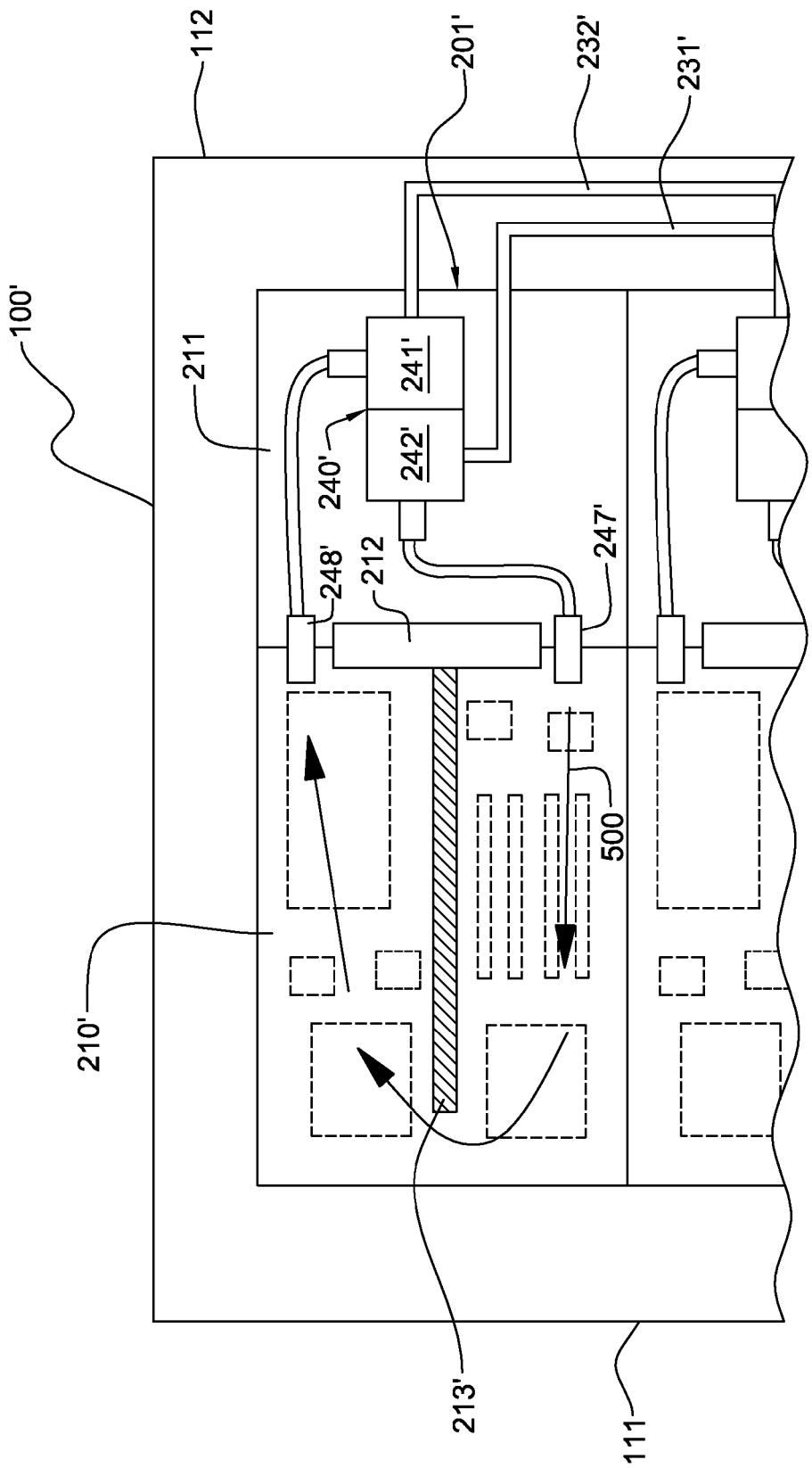
FIG. 5 is a partial elevational view of an alternate embodiment of a cooled electronics rack, comprising (in the illustrated embodiment) a stack of multi-blade center systems and an immersion-cooling apparatus, in accordance with an aspect of the present invention.

FIG. 5 depicts an alternate embodiment of a cooled electronics module, generally denoted 100', in accordance with an aspect of the present invention. In this embodiment, the rack-level inlet and outlet manifolds 231', 232' are repositioned from the front 111 of the cooled electronics rack (see FIG. 2) to the back 112 of the cooled electronics rack 100'. Additionally, the chassis-level manifold assemblies 240' are repositioned to space 211 at the back of the respective electronic system chassis. Blind mate quick connect couplings 247', 248' facilitate insertion of the immersion-cooled blade 210' into operative fluid communication with the respective coolant supply manifold 242' and coolant return manifold 241' of the chassis-level manifold assembly 240'. The blind mate quick connect couplings may comprise a pair of mating blind mate connectors that are disposed on the immersion-cooled blades, as well as within the electronic system chassis of the multi-blade center system 201'. Advantageously, the chassis-level manifold assembly 240' is readily accommodated within space 211 previously occupied by the conventional air-moving devices at the back portion of an air-cooled, multi-blade center system. Because of the positioning of the chassis-level manifold assemblies, either flexible or rigid tubing could be employed to connect each manifold assembly to the respective blind mate quick connect couplings 247', 248'. Also shown in this figure is a baffle 213' comprising a central portion of a filler element which (as described above) directs flow of coolant 500 over and around the multiple different types of components of the electronic subsystem being immersion-cooled by the coolant.

Although preferred embodiments have been depicted and described in detail herein, it will, be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronic subsystem, the apparatus comprising:
    a container sized to receive an electronic subsystem therein, the electronic subsystem comprising multiple different types of components disposed on a circuit board;
    a coolant inlet port and a coolant outlet port coupled to the container for facilitating ingress and egress of coolant through the container, wherein when the electronic subsystem is operatively inserted into the container and coolant flows therethrough, the multiple different types of components of the electronic subsystem are immersion-cooled by the coolant, with the coolant flowing over and covering the multiple different types of components of the electronic subsystem;
    a coolant pump assembly coupled in fluid communication with the coolant inlet port and the coolant outlet port of the container for facilitating active pumping of coolant through the container in a direction parallel to the circuit board over the multiple different types of components to provide pumped immersion-cooling of the electronic subsystem when operatively disposed therein; and
    a filler element disposed within the container over the multiple different types of components and sized and configured to reduce an amount of the coolant within the container, the filler element projecting from over the multiple different types of components to between multiple components of the multiple different types of components to partially displace coolant within the container between the multiple components, while still maintaining the multiple different types of components of the electronic subsystem immersion-cooled by the coolant.

2. The apparatus of claim 1, wherein the filler element contacts the circuit board between at least two components of the multiple different types of components.

3. The apparatus of claim 1, wherein the filler element is sized to fill at least 30% of the container's internal space, thereby reducing a maximum amount of coolant utilized within the container at any time.

4. The apparatus of claim 1, wherein the filler element is one of a molded filler element or an inflatable filler element disposed within the container.

5. The apparatus of claim 1, wherein the filler element is configured to direct flow of coolant through the container, while maintaining the multiple different types of components of the electronic subsystem immersion-cooled by the coolant.

6. The apparatus of claim 1, wherein the filler element is configured to define at least one coolant flow channel between the filler element and the multiple different types of components of the electronic subsystem being immersion-cooled by the coolant, with the coolant being actively pumped through the at least one coolant flow channel in contact with and over the multiple different types of components in the direction parallel to the circuit board.

7. The apparatus of claim 1, wherein the filler element is configured with a central portion thereof at least partially contacting the circuit board of the electronic subsystem, the central portion of the filler element preferentially directing coolant flow through the container with the coolant pump assembly actively pumping coolant through the container.

8. The apparatus of claim 7, further comprising at least one opening in the central portion of the filler element to preferentially route a portion of the coolant flowing through the container from one region of the container to another region of the container separated by the central portion of the filler element, the preferential routing facilitating cooling of at least one component of the multiple different types of components of the electronic subsystem.

9. A cooled electronics rack comprising:
    an electronics rack at least partially surrounding and supporting at least one electronic system chassis, the at least one electronic system chassis comprising at least one electronic subsystem, each electronic subsystem comprising multiple different types of components disposed on a circuit board; and
    at least one apparatus for facilitating cooling of the at least one electronic subsystem, each apparatus of the at least one apparatus comprising:
        a container sized to receive therein a respective electronic subsystem of the at least one electronic subsystem;
        a coolant inlet port and a coolant outlet port coupled to the container for facilitating ingress and egress of coolant through the container, wherein when the respective electronic subsystem is operatively inserted into the container and coolant flows therethrough, the multiple different types of components of the electronic subsystem are immersion-cooled by the coolant, with the coolant flowing over and covering multiple different types of components of the electronic subsystem;
    a coolant pump assembly coupled in fluid communication with the coolant inlet port and the coolant outlet port of each container for facilitating active pumping of coolant through the container in a direction parallel to the circuit board over the multiple different types of components to provide immersion-cooling of the respective electronic subsystem when operatively disposed therein; and
    a filler element disposed within the container over the multiple different types of components and sized and configured to reduce an amount of the coolant within the container, the filler element projecting from over the multiple different types of components to between multiple components of the multiple different types of components to partially displace coolant within the container between multiple components, while still maintaining the multiple different types of components of the electronic subsystem immersion-cooled by the coolant.

10. The cooled electronics rack of claim 9, wherein at least one container of the at least one apparatus is sized and configured for operative insertion into a respective electronic subsystem chassis of the at least one electronic subsystem chassis, and wherein the cooled electronics rack further comprises at least one chassis-level manifold assembly comprising a coolant supply manifold and a coolant return manifold coupled in fluid communication with the coolant inlet port and the coolant outlet port, respectively, of the at least one container.

11. The cooled electronics rack of claim 10, wherein each electronic system chassis of the at least one electronic system chassis comprises multiple electronic subsystems, and wherein the cooled electronics rack comprises multiple apparatuses for facilitating cooling of the multiple electronic subsystems, and the coolant supply manifold of the chassis-level manifold assembly comprises multiple supply ports, each supply port being coupled in fluid communication with a respective coolant inlet port of a respective container of the multiple apparatuses, and wherein the coolant return manifold comprises multiple return ports, each return port being coupled in fluid communication with a respective coolant outlet port of a respective container of the multiple apparatuses, wherein the coolant supply manifold facilitates supply of coolant in parallel to multiple containers of the multiple apparatuses and the coolant return manifold facilitates return of coolant in parallel from the multiple containers of the multiple apparatuses.

12. The cooled electronics rack of claim 11, wherein the at least one chassis-level manifold assembly comprises at least one slidable chassis-level manifold assembly, and the coolant is a dielectric coolant.

13. The cooled electronics rack of claim 9, wherein the filler element of each apparatus of the at least one apparatus contacts the circuit board between at least two components of the multiple different types of components of the respective electronic subsystem.

14. The cooled electronics rack of claim 9, wherein the filler element of each apparatus of the at least one apparatus is configured to direct flow of coolant through the container, while maintaining the multiple different types of components of the respective electronic subsystem immersion-cooled by the coolant.

15. The cooled electronics rack of claim 9, wherein the filler element of each apparatus of the at least one apparatus is configured to define at least one coolant flow channel between the filler element and the multiple different types of components of the respective electronic subsystem being immersion-cooled by the coolant, with the coolant being actively pumped through the at least one coolant flow channel in contact with and over the multiple different types of components in the direction parallel to the circuit board.

16. The cooled electronics rack of claim 9, wherein the filler element of each apparatus is sized and configured with a central portion thereof at least partially contacting the circuit board of the electronic subsystem, the central portion of the filler element preferentially directing coolant flow through the container with the coolant pump assembly actively pumping coolant through the container.

17. A method of facilitating cooling of an electronic subsystem, the method comprising:
providing a container sized to receive an electronic subsystem therein, the container comprising a coolant inlet port and a coolant outlet port coupled to the container for facilitating ingress and egress of coolant through the container, the electronic subsystem comprising multiple different types of components to be immersion-cooled, with the coolant flowing over and covering the multiple different types of components of the electronic subsystem;
coupling a coolant pump assembly in fluid communication with the coolant inlet port and the coolant outlet port to facilitate active pumping of coolant through the container in a direction parallel to the circuit board over the multiple different types of components to provide pumped immersion-cooling of the multiple different types of components of the electronic subsystem when the electronic subsystem is operatively disposed within the container; and
providing a filler element disposed over the multiple different types of components within the container and sized and configured to reduce an amount of the coolant within the container, the filler element projecting from over the multiple different types of components to between multiple components of the multiple different types of components to partially displace coolant within the container between the multiple components, while still maintaining the multiple different types of components of the electronic subsystem immersion-cooled by the coolant.

18. The method of claim 17, wherein the container is sized and configured to operatively insert into a blade-center chassis of a multi-blade center system, and wherein the electronic subsystem is an immersion-cooled blade.

19. The method of claim 18, wherein the filler element is configured to direct flow of coolant through the container, and wherein the filler element contacts the circuit board between at least two components of the multiple different types of components.

20. The method of claim 17, wherein the filler element is configured to define at least one coolant flow channel between the filler element and the multiple different types of components in the electronic subsystem being immersion-cooled by the coolant, with the coolant being actively pumped through the at least one coolant flow channel in contact with and over the multiple different types of components in the direction parallel to the circuit board.

* * * * *